(12) United States Patent
Kothandaraman

(10) Patent No.: US 6,617,914 B1
(45) Date of Patent: Sep. 9, 2003

(54) ELECTRICAL ANTIFUSE WITH EXTERNAL CAPACITANCE

(75) Inventor: Chandrasekharan Kothandaraman, Bogota, NJ (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/092,114

(22) Filed: Mar. 5, 2002

(51) Int. Cl.[7] .......................... G11C 11/34; H01L 21/82
(52) U.S. Cl. ...................... 327/525; 257/530; 438/600; 365/225.7
(58) Field of Search ............................ 327/525; 365/96, 365/225.7; 257/530; 438/467, 600

(56) References Cited

U.S. PATENT DOCUMENTS

| | | | |
|---|---|---|---|
| 5,257,222 A | | 10/1993 | Lee ............................. 365/96 |
| 5,463,244 A | * | 10/1995 | De Araujo et al. .......... 257/530 |
| 5,793,224 A | * | 8/1998 | Sher ......................... 365/225.7 |
| 5,896,041 A | * | 4/1999 | Sher et al. ................... 327/525 |
| 6,096,580 A | * | 8/2000 | Iyer et al. ................... 438/132 |
| 6,163,488 A | * | 12/2000 | Tanizaki et al. ........... 365/225.7 |

FOREIGN PATENT DOCUMENTS

| JP | 2000-200498 | * | 7/2000 | ............ G11C/29/00 |
|---|---|---|---|---|

OTHER PUBLICATIONS

Hideki Satake and Akira Toriumi, "Dielectric Breakdown Mechanism of Thin-$SiO_2$ Studied by the Post-Breakdown Resistance Statistics," *IEEE Transactions OnElectron Devices,*, vol. 47, No. 4, pp. 741–745, Apr. 2000.

J.C. Jackson, Ö. Oralkan, T. Robinson and G. A. Brown, "The Non-Uniqueness of Breakdown Distributions in Silicon Oxides", *1997 IRW Final Report, IEEE*, pp. 50–55.

* cited by examiner

Primary Examiner—Timothy P. Callahan
Assistant Examiner—Terry L. Englund
(74) *Attorney, Agent, or Firm*—Jackson Walker L.L.P.

(57) ABSTRACT

An antifuse having a dielectric disposed between a plurality of conductive elements is programmed with one of the conductive elements connected to a capacitor. The antifuse is programmed to an "on" state by precharging the capacitor and then applying a programming voltage to another one of the conductive elements. This results in the breakdown of the interposed dielectric to form a conductive link between the conductive elements. Immediately, following the formation of a conductive link, the electrical energy stored in the capacitor is released through the conductive link across the dielectric. Further, the capacitor can be common to a plurality of programmable antifuses and the application of the programming voltage serves to select one of the plurality of antifuses to be 'blown'. This arrangement can be realized in a FET and the device can be easily integrated in the CMOS process commonly used for the manufacture of memory arrays and logic circuitry.

18 Claims, 2 Drawing Sheets

● COMMUNICATING TRAPS
○ NON-COMMUNICATING TRAPS

ELECTRICAL ANTIFUSE WITH EXTERNAL CAPACITANCE

BACKGROUND OF THE INVENTION

1. Technical Field of the Invention

The present invention relates to the field of semiconductors and, more particularly, to programmable antifuse elements in semiconductor memory devices.

2. Description of the Related Art

Integrated circuits often require selectively programmable electrical connections between circuit nodes. Such connections can be implemented by use of an antifuse link which is programmable to interconnect electrodes. For example, antifuses are often used in memory cell arrays such as dynamic random access memories in which failing cell addresses are remapped to functional cell addresses by selective programming of antifuses.

Generally, antifuses are fabricated with conductive electrical terminals separated by a dielectric layer. In an "off" state, the anti-fuse has a high resistance between its terminals. The antifuse can be programmed to an "on" state (i.e., a low resistance) by breaking down the interposed dielectric to form a conductive link between the antifuse terminals as described in U.S. Pat. No. 5,257,222, entitled "Antifuse Programming By Transistor Snap-Back".

Other currently applied antifuse types are structures based on a conventional MOS transistor. Here the MOS transistor is not used in the conventional sense, either as an amplifier or as a switching element, but as a configuration for realizing a dielectric layer ('Gate—oxide') interposed between the gate, source and drain. Such a transistor antifuse is programmed or "blown" by applying a sufficient field or "blow" voltage across the gate oxide of the MOS transistor. The blow process results in a damaged dielectric, which reduces the electrical resistance across the dielectric. Although this blow voltage must reach a threshold value for any breakage to occur in the dielectric, the final resistance resulting from this breakage is lowered if more energy is applied to the antifuse dielectric.

Evaluation circuits attached to the anti-fuse are used to differentiate between the high resistance of the intact oxide ($R_{off}$) and the lowered resistance of the damaged oxide ($R_{on}$). The larger the resistance of a programmed antifuse in a memory cell the harder it becomes to determine the status of the antifuse (blown versus unblown).

Typical values for $R_{off}$ are in the range of $10^{12}$ ohms. The range of $R_{on}$ largely depends on the parameters during the blow process. High blow voltage and high blow current generally lead to lower $R_{on}$ resistances. However, it is desired to minimize those two parameters in order to reduce the size of the associated circuits (e.g. blow voltage generator, blow transistor, wiring, etc.). In current designs, a compromise is made to balance the minimum current needed to reliably blow the antifuse and the area requirements of the blow transistor device to handle that current. From that perspective, values of $R_{on}$ in the range of $10^5$ ohms to $10^8$ ohms are common. However, with this range of $R_{on}$ commonly used evaluation circuits are not able to accurately distinguish an unblown anti-fuse and a blown anti-fuse exhibiting the relatively high $R_{on}$ values. Thus, an antifuse may erroneously be detected as un-programmed if the blown antifuse resistance $R_{on}$ is sufficiently large.

Thus, there is a need for an improved approach to programming an antifuse which provides a more robust electrical connection which is readily verifiable and distinguishable from an un-programmed antifuse.

SUMMARY OF THE INVENTION

The present invention achieves technical advantages as an apparatus, system and method of programming an antifuse comprising of a dielectric interposed between two conductive elements. One of the conductive elements is attached to a capacitor that is precharged to a set voltage. The antifuse is programmed to an "on" state by breaking down the interposed dielectric to form a conductive link between the antifuse terminals from the application of a programming voltage across the conductive elements. Responsive to the applied programming voltage, a field appears on the dielectric which leads to formation of conductive links across it. Electrical energy stored in the capacitor, in response to the formation of these conductive links, is immediately discharged through the links causing a more robust electrical connection between the conductive elements. A particular antifuse can be selected for programming, within an array of such devices, by applying the programming voltage only to the conductive elements of the selected antifuse. Further, the capacitor can be common to a plurality of antifuses in which the capacitor's stored energy is applied to a select one of the plurality of antifuses, rendered operable by the application of the programming voltage to the conducting elements of the selected antifuse.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
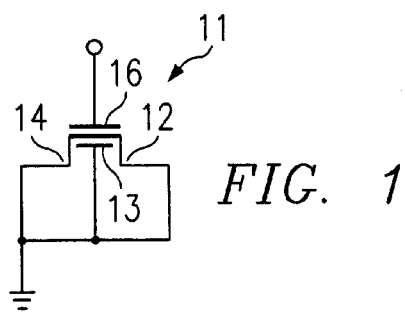
FIG. 1 illustrates a field effect transistor anti fuse and electrical connections for applying a programming voltage across the oxide dielectric.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Throughout the drawings, it is noted that the same reference numerals or letters will be used to designate like or equivalent elements having the same function. A detailed description of known functions and constructions unnecessarily obscuring the subject matter of the present invention have been omitted for clarity.

Referring now to FIG. 1 there is illustrated a biasing arrangement for a MOS transistor antifuse 11 in accordance with an exemplary embodiment of the present invention. In this embodiment, the antifuse is a transistor antifuse where one conductive element is formed by the source 14, drain 12 and body 13 which are electrically connected and a second conductive element is formed by the gate 16 with the gate oxide forming the interposed dielectric. The transistor antifuse 11 is programmed or "blown" by applying a sufficient field or "blow" voltage across the gate oxide via the body 13 and the gate 16. The blow process results in a damaged gate-oxide or dielectric, which reduces the electrical resistance across the dielectric. The magnitude of the voltage needed to program the antifuse depends on several factors among which the thickness of the gate oxide should be considered.

Figure 2A:
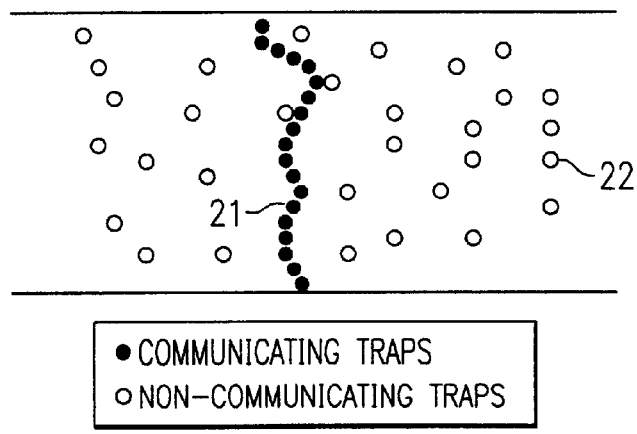
FIG. 2A illustrates the formation of a filament after a programming voltage is applied across the dielectric.

As the blow voltage is applied, quasi breakdown events are initiated in the gate oxide resulting in the formation of local charge centers or 'traps' 22 (FIG. 2A). When a sufficient number of traps are created they tend to join together, due to the applied field as a conductive filament 21, as exemplified in FIG. 2A. This conductive filament enables current to flow thus drawing energy into the system from the power source. Sometimes this filament may disappear due to this energy dissipation but only to reappear at a different location. After a number of such events, there is a catastrophic event (illustrated as a plot diagram in FIG. 2B) that causes the formation of a stable filament resulting in the final low resistance state.

Figure 2B:
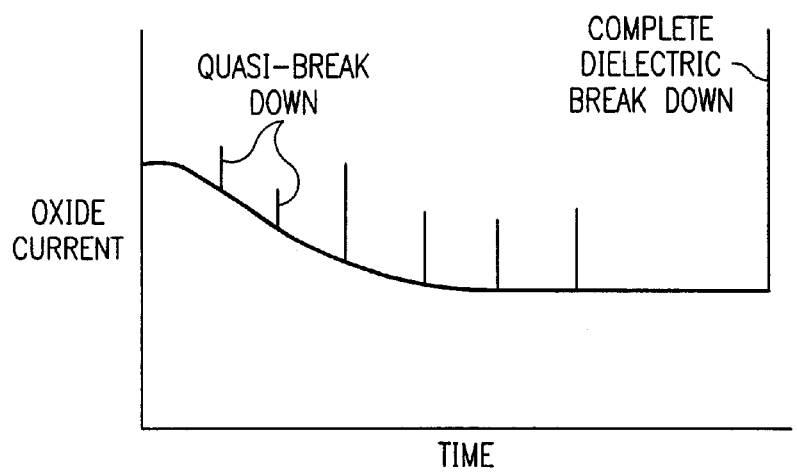
FIG. 2B shows a graph of oxide current versus time during the application of a programming voltage.

FIG. 2B shows the oxide current over a period of time with a blow voltage applied across the gate and the body. The several spikes in the current are due to the appearance and subsequent disappearance of the filaments. The final large spike indicates the catastrophic event caused by the formation of a stable filament. After programming (blown), the resistance between the gate 16 and body 13 is reduced from a typical starting resistance of $10^{12}$ ohms (unprogrammed or unblown). However, the conductive filament 22 between the antifuse terminals is sometimes only marginally conductive, leaving a relatively high resistance, which is difficult to detect by evaluation circuits.

Figure 3:
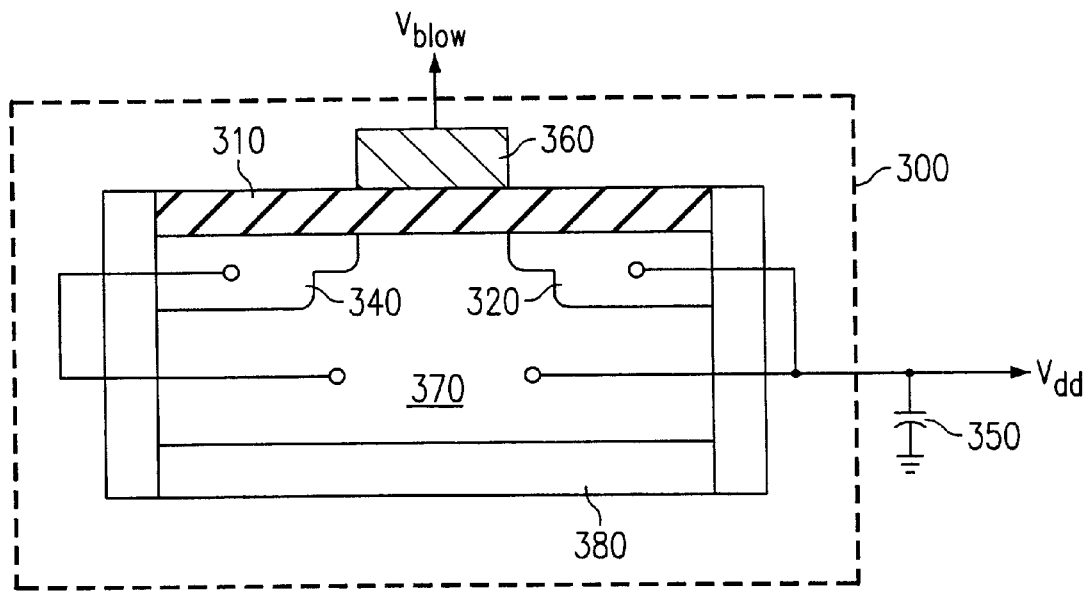
FIG. 3 illustrates a field effect transistor with associated circuitry for applying a programming voltage across the dielectric in accordance with an exemplary embodiment of the present invention.

Referring now to FIG. 3 there is illustrated a field effect transistor (FET) antifuse 300 with associated circuitry for applying a programming voltage across the dielectric in accordance with an exemplary embodiment of the present invention. As shown, circuitry couples the body 370, drain 320 and the source 340 to a power supply. In addition, a capacitor 350 or other similar electric energy storage device is included external to the FET antifuse 300 and serially coupled to the drain 320, body 370 and the source 340. The body 370 of the FET antifuse 300 can be connected to an integrated capacitor made on the same substrate. Further, the body 370 is electrically isolated from the substrate or other circuitry on the same chip by an isolation layer 380.

In this embodiment of the invention, the FET antifuse 300 is programmed by the application of a positive voltage on the gate 360 so that a field appears across the gate-oxide 310. The capacitor 350, which has been pre-charged to a set negative voltage, increases the field appearing across the gate-oxide 310 in addition to being a reservoir of some energy prior to the blow operation. When the gate voltage is applied, the generation of the first links across the gate-oxide 310 provides a path for the immediate discharge, of the energy stored in the capacitor 350, across the oxide 310. This additional energy enables the formation of additional links and/or increases the diameter of the first links that are formed across the oxide 310. The magnitude of the additional energy is related to the capacitance and the pre-charge voltage as:

$$E = \tfrac{1}{2} C\, Vdd^2.$$

Where E is the total energy available, C is the capacitance and Vdd is the pre-charge voltage. The magnitude of the pre-charge voltage used should be such that it does not damage the dielectric of an unselected fuse. Further, it is constrained by the nature of the isolation layer 380. Typical values could range between −1.5V and −2.5V. The magnitude of the capacitance achievable depends on the area and the type of capacitor used. Typical values ranges between 1 nanoFarad and 300 nanoFarads.

In addition, the capacitor 350 can be adapted to be common to an array of antifuses (further discussed herein) thus decreasing the total area occupied by the antifuses. Further, the capacitor 350 can be integrated with the FET antifuse in a standard CMOS process used for the manufacture of integrated circuits. A suitable way to integrate a capacitor of necessary capacity within close proximity to the antifuse is the by the use of devices such as Metal Insulator Metal Capacitors (MIMCAP) or Deep Trench (DT) capacitors.

For the programming operation, Vdd is applied to capacitor 350 which precharges it to a redetermined voltage level. The maximum desirable value of Vdd is limited by the thickness of he gate oxide, as an excessively large voltage could damage the gate oxide even prior to programming and by the type of isolation 380 of the transistor. In this embodiment, Vdd is in the range of approximately −1.5 to −2.5 V and the gate oxide ranges between 20 angstroms to 35 angstroms. Further, a bias voltage (hereinafter referred to as Vblow) is applied to the gate 360 in which Vblow is preferably in the range of 5V to 8V. Although the same field in the oxide can be obtained by using the same voltages but of the opposite polarity, it is believed that the programming is enhanced with this particular choice of the polarity.

Following the application of Vblow, the first conductive links are formed in the gate-oxide 310. It is important to note that the voltage Vdd in itself, without Vblow, is not high enough to start this process, for in such a case the ability to select a specific antifuse to be programmed would be lost. The stored energy in the capacitor 350 is instantaneously discharged across the damaged gate-oxide 310, which forms additional conductive links and/or causes the increase of the diameter of the first formed conductive links. With this programming approach, the resistance of the antifuse 300 is lowered to a range of approximately $10^3$ to $10^4$ ohms while without the capacitor typical final resistances range from $10^6$ to $10^8$ ohms. The additional conductive links and/or increased diameter of the first formed conductive links also improve the reliability and consistency of the blow operation.

Figure 4:
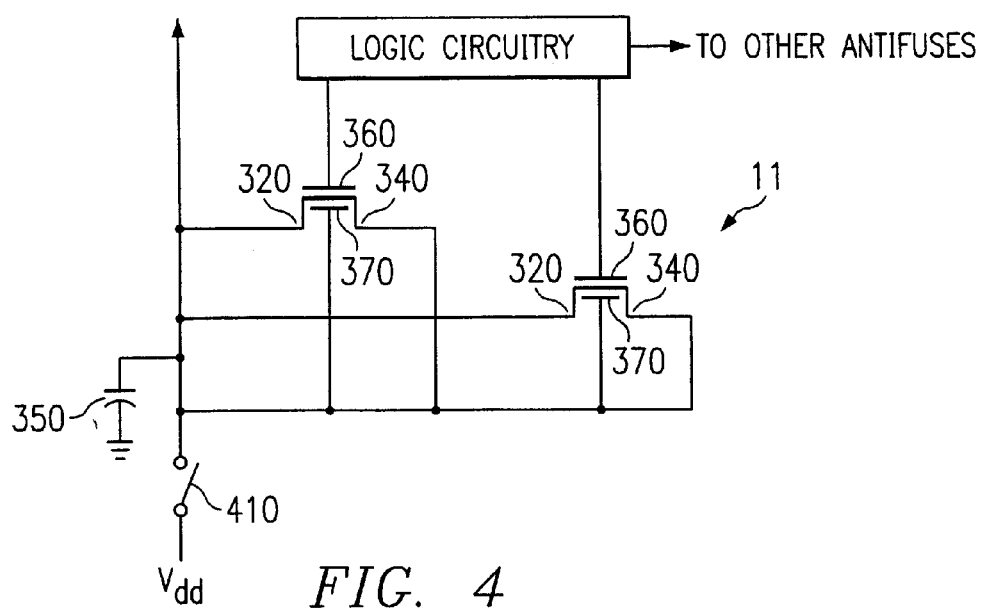
FIG. 4 illustrates an arrangement for applying a programming voltage across the dielectric of a select one of a plurality of field effect transistors in accordance with an exemplary embodiment of the present invention.

Referring now to FIG. 4 there is illustrated an arrangement for applying a programming voltage across the dielectric of a select one of a plurality of field effect transistor antifuses in accordance with an exemplary embodiment of the present invention. The circuitry is adapted to couple, in parallel, a plurality of FET antifuses with a common capacitor 350. Vblow and Vdd are chosen such that only those antifuses to which Vblow is applied are programmed. Vdd is applied to the body 370 of all the antifuses and also serves to precharge the capacitor 350. Vdd can be applied through a switch 410. Vblow can be selectively applied to different ones of the FET gates 360 (e.g. by suitable logic circuitry) so that only those antifuses that are selected are blown. Note that only two antifuses are explicitly shown, however, many other antifuses can be included, as indicated in FIG. 4. In the programmed antifuse, conductive filaments are formed, while in the remaining antifuses they are not, as the field across their gate oxides is lower.

The above described capacitor arrangements can be easily integrated into the standard process used in the manufacture of CMOS memory devices. Generally, such memory devices are made of individual memory cells and include redundant cells for faulty memory cell replacement. A test program can locate faulty memory cells and subsequently appropriately coupled antifuses, such as described above, are blown so that they enable the replacement of the faulty cells with the redundant cells. A collection of antifuses can also be used as Programmable Read Only Memory elements (PROM) or for customizable chips (Field Programmable Gate Arrays).

It should be noted that although the present embodiments have been described in terms of programming a FET transistor antifuse, the present invention can be implemented with other types of antifuses in which a dielectric is interposed between conductive elements.

Although a preferred embodiment of the method, apparatus, and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A method of programming any selected one of a plurality of antifuses, each antifuse comprising a dielectric disposed between conductive elements, said method comprising:

storing electrical energy in a storage device coupled to one of said conductive elements for each antifuse;

applying a programming voltage to a further one of said conductive elements of a selected antifuse; and releasing said stored electrical energy across said dielectric of said selected antifuse via said one and said further one conductive elements responsive to said applied programming voltage.

2. The method of claim 1 further comprising forming a conductive filament through said dielectric of said selected antifuse responsive to said applied programming voltage.

3. The method of claim 2, wherein said releasing step further comprises passing current through one of said conductive filament and a further conductive filament.

4. The method of claim 1 further comprising reducing a resistance between said one and said further one conductive elements of said selected antifuse to a range of approximately $10^3$ to $10^4$ ohms.

5. The method of claim 1, wherein said programming voltage is in a range of approximately 5 to 8 volts.

6. The method of claim 1, wherein each said antifuse is a field effect transistor antifuse, said dielectric is a gate oxide of said field effect transistor antifuse, said further one conductive element is a gate of said field effect transistor antifuse, and said one conductive element is a drain, source and body of said field effect transistor antifuse, wherein said drain, source and body are electrically coupled.

7. The method of claim 6, wherein said storage device is a capacitor precharged to a predetermined voltage by applying a power supply to said bodies of said field effect transistor antifuses.

8. An apparatus comprising:

a plurality of antifuses each having a dielectric disposed between a plurality of conductive elements;

an input coupled to one of said plurality of conductive elements of each said antifuse and adapted to permit application of a programming voltage to any selected one of said antifuses; and a storage device coupled to a further one of said plurality of conductive elements of each said antifuse and operable to store electric energy, said storage device further operable to release said stored electric energy to a selected said antifuse responsive to application of said programming voltage.

9. The apparatus of claim 8, wherein said storage device is a capacitor.

10. The apparatus of claim 8, wherein said selected antifuse is responsive to said programming voltage for forming a conductive link through said dielectric thereof, and wherein said storage device is operable to pass a current through one of said conductive link and a further conductive link.

11. The apparatus of claim 10, wherein a resistance between said one and said further one conductive elements of said selected antifuse is reduced to a range of approximately $10^3$ to $10^4$ ohms responsive to said storage device passing the current through one of said conductive link and said further conductive link.

12. The apparatus of claim 8, wherein each said antifuse is a field effect transistor, said one conductive element is a gate of said field effect transistor, said dielectric is a gate oxide of said field effect transistor, and said further one conductive element is an electrically coupled arrangement of a drain, source and body of said field effect transistor.

13. A system for use with a plurality of addressable memory cells, said system comprising:

a plurality of programmable antifuses each having a dielectric disposed between a plurality of conductive elements and operable to provide remapping of a memory cell address;

an input structure coupled to one of said plurality of conductive elements for each antifuse and adapted to permit a programming of any selected one of said programmable antifuses by application of a programming voltage thereto; and a storage device coupled to a further one of said plurality of conductive elements for each antifuse and operable to store electric energy, said storage device further operable to release said stored electric energy to a selected programmable antifuse responsive to said applied programming voltage.

14. The system of claim 13, wherein said selected antifuse is responsive to said programming voltage for forming a conductive link through said dielectric thereof, and wherein said storage device is operable to pass a current through one of said conductive link and a further conductive link.

15. The system of claim 14, wherein a resistance between said one and said further one conductive elements of said selected antifuse is reduced to a range of approximately $10^3$ to $10^4$ ohms responsive to said storage device passing the current through one of said conductive link and said further conductive link.

16. The system of claim 13, wherein each said antifuse is a field effect transistor said one conductive element is a gate of said field effect transistor, said dielectric is a gate oxide of said field effect transistor, and said further one conductive element is an electrically coupled arrangement of a drain, source and body of said field effect transistor.

17. The system of claim 16, wherein said storage device is a capacitor precharged to a predetermined voltage by applying a power supply to said bodies of said field effect transistors.

18. The system of claim 13, wherein said programming voltage is in a range of approximately 5 to 8 volts.

* * * * *